US009520137B2

(12) United States Patent
Lopez et al.

(10) Patent No.: US 9,520,137 B2
(45) Date of Patent: Dec. 13, 2016

(54) METHOD FOR SUPPRESSING THE LATE REVERBERATION OF AN AUDIO SIGNAL

(71) Applicant: ARKAMYS, Paris (FR)

(72) Inventors: Nicolas Lopez, Paris (FR); Gaël Richard, Viroflay (FR); Yves Grenier, Magny les Hameaux (FR)

(73) Assignee: ARKAMYS, Paris (FR)

( * ) Notice: Subject to any disclaimer, the term of this patent is extended or adjusted under 35 U.S.C. 154(b) by 0 days.

(21) Appl. No.: 14/907,216

(22) PCT Filed: Jul. 21, 2014

(86) PCT No.: PCT/EP2014/065594
§ 371 (c)(1),
(2) Date: Mar. 2, 2016

(87) PCT Pub. No.: WO2015/011078
PCT Pub. Date: Jan. 29, 2015

(65) Prior Publication Data

US 2016/0210976 A1 Jul. 21, 2016

(30) Foreign Application Priority Data

Jul. 23, 2013 (FR) ..................................... 13 57226

(51) Int. Cl.

| | |
|---|---|
| ***H04B 3/20*** | (2006.01) |
| ***H04R 29/00*** | (2006.01) |
| ***H03G 3/00*** | (2006.01) |
| ***H04B 15/00*** | (2006.01) |
| ***G10L 19/06*** | (2013.01) |
| ***G10L 21/02*** | (2013.01) |

(Continued)

(52) U.S. Cl.
CPC ............ *G10L 19/06* (2013.01); *G10K 11/002* (2013.01); *G10L 19/0212* (2013.01); *G10L 21/02* (2013.01); *G10L 2021/02082* (2013.01)

(58) Field of Classification Search
CPC ................ G10L 19/06; G10L 19/0212; G10L 2021/02082; G10L 21/0208; G10K 11/002; H04B 3/20; H04R 3/02
USPC .................. 381/66, 56, 83, 93, 63, 94.2, 58
See application file for complete search history.

(56) References Cited

U.S. PATENT DOCUMENTS

| | | | | |
|---|---|---|---|---|
| 8,116,471 | B2 * | 2/2012 | Derkx | G10L 21/02 381/66 |
| 9,454,956 | B2 * | 9/2016 | Kondo | G10K 15/08 |

OTHER PUBLICATIONS

Nakatani et al., "Speech Dereverberation Based on Variance-Normalizes Delayed Linear Prediction," IEEE Transactions on Audio, Speech and Language Processing, Sep. 1, 2010, pp. 1717-1731, vol. 18, No. 7, IEEE, New York, USA.

(Continued)

*Primary Examiner* — Thjuan K Addy
(74) *Attorney, Agent, or Firm* — Im IP Law PLLC; C. Andrew Im

(57) ABSTRACT

A method for suppressing the late reverberation of an audio signal. A plurality of prediction vectors are calculated. A plurality of observation vectors from the modulus of the complex time-frequency transform of an input signal is generated. A plurality of synthesis dictionaries from the plurality of observation vectors are constructed. A late reverberation spectrum from the plurality of synthesis dictionaries and the plurality of prediction vectors are estimated. A plurality of observation vectors are filtered to eliminate the late reverberation spectrum and obtain a dereverberated signal modulus.

6 Claims, 3 Drawing Sheets

(51) Int. Cl.
*G10K 11/00* (2006.01)
*G10L 19/02* (2013.01)
*G10L 21/0208* (2013.01)

(56) References Cited

OTHER PUBLICATIONS

Kinoshita et al., Suppression of late Reverberation Effect on Speech Signal Using Long-Term Multiple-step Linear Prediction, IEEE Transactions on Audio, Speech and Language Processing, May 1, 2009, pp. 534-545, vol. 17, No. 4, IEEE, New York, USA.
Habets et al., Late Reverberant Spectral Variance Estimation Based on a Statistical Model, IEEE signal processing letters, IEEE service center, Piscataway, NJ, US, vol. 16, No. 9, Sep. 1, 2009, pp. 770-773.
Li et al., "Feature Denoising Using Joint Sparse, Representation for In-Car Speech Recognition," IEEE Signal Processing Letters, Jul. 1, 2013, pp. 681-684, vol. 20, No. 7, IEEE, Piscataway, USA.
Ephraim et al., "Speech Enhancement Using a Minimum Mean-Square Error Short-Time Spectral Amplitude Estimator," IEEE Transactions on Acoustics, Speech and Signal Processing, Dec. 1, 1984, pp. 1109-1121, vo. ASSP-32, No. 6, IEEE, New York, USA.
Gillespie et al., "Speech dereverbation via maximum-kurtosis sub-band adaptive filtering," Proc. International Conference on Acoustics, Speech and Signal Processing, 2001, pp. 3701-3704, vol. 6, IEEE.
Wu et al., "A two-stage algorithm for one-microphone reverberant speech enhancement," IEEE Transactions on Audio, Speech and Language Processing, May 2006, pp. 774-784, vol. 14, No. 3, IEEE.
Mosayyebpour et al., "Single Channel Inverse Filtering of Room Impulse Response by Maximizing Skewness of LP Residual," International Conference on Signal Acquisition and Processing, Feb. 9-10, 2010, pp. 130-134, IEEE.
Bees et al., "Reverberant speech enhancement using cepstral processing," ICASSP '91 Proceedings of the Acoustics, Speech and Signal Processing, Apr. 14-17, 1991, pp. 977-980, vol. 2, IEEE.
Habets, "Single-and Multi-Microphone Speech Dereverberation using Spectral Enhancement," PhD thesis, Technische Universiteit Eindhoven, 2007.
Yoshioka, "Speech Enhancement in Reverberant Environments," PhD thesis, Kyoto University, Mar. 2010.
Kameoka et al., "Robust speech dereverberation based on non-negativity and sparse nature of speech spectrograms," Proceedings of the 2009 IEEE International Conference on Acoustics, Speech and Signal Processing, ICASSP '09, Apr. 19-24, 2009, pp. 45-48, IEEE.

* cited by examiner

METHOD FOR SUPPRESSING THE LATE REVERBERATION OF AN AUDIO SIGNAL

RELATED APPLICATIONS

This application is a §371 application from PCT/EP2014/065594 filed Jul. 21, 2014, which claims priority from French Patent Application No. 13 57226 filed Jul. 23, 2013, each of which is herein incorporated by reference in its entirety.

TECHNICAL FIELD

The invention relates to a method for suppressing the late reverberation of an audio signal. The invention is more particularly, thought not exclusively, adapted to the field of processing reverberation in an enclosed space.

PRIOR ART

FIG. 1 shows an omnidirectional sound source 100 positioned in an enclosed space 110 such as an automotive vehicle or a room, and a microphone 120. An audio signal emitted by the omnidirectional sound source 100 propagates in all directions. Thus, the signal observed at the level of the microphone is formed by the superimposition of several delayed and attenuated versions of the audio signal emitted by the omnidirectional sound source 100. In essence, the microphone 120 initially captures the source signal 130, also called the direct signal 130, but also the signals 140 reflected off the walls of the enclosed space 110. The various reflected signals 140 have traveled along acoustic paths of various lengths and have been attenuated by the absorption of the walls of the enclosed space 110; the phase and the amplitude of the reflected signals 140 captured by the microphone 120 are therefore different.

There are two types of reflections, early reflections and late reverberation. The microphone 120 captures the early reflection signals with a slight delay relative to the source signal 130, on the order of zero to fifty milliseconds. Said early reflection signals are temporally and spatially separated from the source signal 130, but the human ear does not perceive these early reflection signals and the source signal 130 separately due to an effect called the "precedence effect." When the audio signal emitted by the omnidirectional sound source 100 is a speech signal, the temporal integration of the early reflection signals by the human ear makes it possible to enhance certain characteristics of the speech, which improves the intelligibility of the audio signal.

Depending on the size of the room, the boundary between the early reflections and the late reverberation is between fifty and eighty milliseconds. The late reverberation comprises numerous reflected signals that are close together in time and therefore impossible to separate. This set of reflected signals is thus considered from a probability standpoint to be a random distribution whose density increases with time. When the audio signal emitted by the omnidirectional sound source 100 is a speech signal, the late reverberation degrades both the quality of said audio signal and its intelligibility. Said late reverberation also affects the performance of speech recognition and sound source separation systems.

According to the prior art, a first method known as "inverse filtering" attempts to identify the impulse response of the enclosed space 110 in order to then construct an inverse filter that can compensate the effects of the reverberation in the audio signal.

This type of method is for example described in the following scientific publications: B. W. Gillespie, H. S. Malvar and D. A. F. Florèncio, "*Speech dereverberation via maximum-kurtosis subband adaptive filtering,*" *Proc. International Conference on Acoustics, Speech and Signal Processing, Volume* 6 *of ICASSP* '01, pages 3701-3704, IEEE, 2001; M. Wu and D. L. Wang, "*A two-stage algorithm for one-microphone reverberant speech enhancement,*" *Audio, Speech and Language Processing, IEEE Transactions on,* 14(3): 774-784, 2006; and Saeed Mosayyebpour, Abolghasem Sayyadiyan, Mohsen Zareian, and Ali Shahbazi, "*Single Channel Inverse Filtering of Room Impulse Response by Maximizing Skewness of LP Residual.*"

This method uses, in the time domain, distortions introduced by reverberation in parameters of a linear prediction model of the audio signal. Proceeding from the observation that reverberation primarily modifies the residual of the linear prediction model of the audio signal, a filter that maximizes the higher order moments of said residual is constructed. This method is adapted to short impulse responses and is primarily used to compensate early reflection signals.

However, this method assumes that the impulse response of the enclosed space 110 does not vary over time. Furthermore, this method does not model late reverberation. Said method must thus be combined with another method for processing the late reverberation. These two methods combined require a large number of iterations before convergence is obtained, which means that said methods cannot be used for a real-time application. Moreover, the inverse filtering introduces artifacts such as pre-echoes, which must then be compensated.

A second method known as the "cepstral" method attempts to separate the effects of the enclosed space 110 and the audio signal in the cepstral domain. In essence, reverberation modifies the average and the variance of the cepstra of the reflected signals relative to the average and the variance of the cepstra of the source signal 130. Thus, when the average and the variance of the cepstra are normalized, the reverberation is attenuated.

This type of method is for example described in the following scientific publication: D. Bees, M. Blostein, and P. Kabal, "*Reverberant speech enhancement using cepstral processing,*" *ICASSP* '91 *Proceedings of the Acoustics, Speech and Signal Processing,* 1991.

This method is particularly useful for voice recognition problems since the reference databases of recognition systems can also be normalized so as to more closely approximate the signals captured by the microphone 120. However, the effects of the closed space 110 and the audio signal cannot be completely separated in the cepstral domain. Using this method therefore produces a distortion of the timbre of the audio signal emitted by the omnidirectional sound source 100. Moreover, this method processes early reflections rather than late reverberation.

A third method known as "estimating the power spectral density of late reverberation" makes it possible to establish a parametric model of the late reverberation.

This type of method is for example described in the following scientific publications: E. A. P. Habets, "*Single-* and *Multi-Microphone Speech Dereverberation using Spectral Enhancement,*" PhD thesis, Technische Universiteit Eindhoven, 2007; and T. Yoshioka, *Speech Enhancement, Reverberant Environments*, PhD thesis, 2010.

According to this third method, an estimation of the power spectral density of the late reverberation makes it possible to construct a spectral subtraction filter for the dereverberation. Spectral subtraction introduces artifacts such as musical noise, but said artifacts can be limited by applying more complex filtering schemes, as used in denoising methods.

However, an important parameter for estimating the power spectral density of late reverberation in the context of this third method is the reverberation time. Reverberation time is parameter that is difficult to estimate with precision. The estimation of the reverberation time is distorted by background noise and other interfering audio signals. Moreover, this estimation of reverberation time is time-consuming and thus increases execution time.

A fourth method exploits the sparsity of speech signals in the time-frequency plane.

This type of method is for example described in the following scientific publication: T. Yoshioka, "*Speech Enhancement in Reverberant Environments,*" PhD thesis, 2010.

In this publication, the late reverberation is modeled as a delayed and attenuated version of the current observation whose attenuation factor is determined by solving a maximum likelihood problem with a sparsity constraint.

This type of method is also described in the following scientific publication: H. Kameoka, T. Nakatani, and T. Yoshioka, "*Robust speech dereverberation based on non-negativity and sparse nature of speech spectrograms,*" *Proceedings of the* 2009 *IEEE International Conference on Acoustics, Speech and Signal Processing, ICASSP* '09, pages 45-48, IEEE Computer Society, 2009.

Dereverberation is approached in this publication as a problem of deconvolution by nonnegative matrix factorization, which makes it possible to separate the response of the enclosed space 110 from the audio signal. However, this method introduces a lot of noise and distortion. Moreover, said method depends on the initialization of the matrices for the factorization.

Furthermore, the methods cited require a plurality of microphones in order to process the reverberation with precision.

SUMMARY OF THE INVENTION

A particular object of the invention is to solve all or some of the above-mentioned problems.

To this end, the invention relates to a method for suppressing the late reverberation of an audio signal, characterized in that it comprises the following steps:

- capture of an input signal formed by the superimposition of several delayed and attenuated versions of the audio signal,
- application of a time-frequency transformation to the input signal in order to obtain a complex time-frequency transform of the input signal,
- calculation of a plurality of prediction vectors,
- creation of a plurality of observation vectors from the modulus of the complex time-frequency transform of the input signal,
- construction of a plurality of synthesis dictionaries from the plurality of observation vectors,
- estimation of a late reverberation spectrum from the plurality of synthesis dictionaries and the plurality of prediction vectors,
- filtering of the plurality of observation vectors so as to eliminate the late reverberation spectrum and obtain a dereverberated signal modulus.

Thus, the method that is the subject of the invention is fast and offers reduced complexity. Said method can therefore be used in real time. Furthermore, this method does not introduce artifacts and is resistant to background noise. Moreover, said method reduces background noise and is compatible with noise reduction methods.

The invention can be implemented according to the embodiments described below, which may be considered individually or in any technically feasible combination.

Advantageously, the method also comprises the following steps:

- creation of a frequency subsampled modulus from the modulus of the complex time-frequency transform of the input signal,
- creation of a plurality of subsampled observation vectors from said frequency subsampled modulus,
- construction of a plurality of analysis dictionaries from the plurality of subsampled observation vectors,
- calculation of the plurality of prediction vectors from the plurality of subsampled observation vectors and the plurality of analysis dictionaries.

Advantageously, the step for calculating the plurality of prediction vectors is performed by minimizing, for each prediction vector, the expression $\|\tilde{X}\nu - D^{\alpha}\alpha\|_2$, which is the Euclidean norm of the difference between the subsampled observation vector associated with said prediction vector and the analysis dictionary associated with said prediction vector multiplied by said prediction vector, taking into account the constraint $\|\alpha\|_1 \leq \lambda$, according to which the norm 1 of said prediction vector is less than or equal to a maximum intensity parameter of the late reverberation.

Advantageously, the value of the maximum intensity parameter of the late reverberation is between 0 and 1.

Advantageously, the method also comprises the following step:

- creation of a dereverberated complex signal from the dereverberated signal modulus and the phase of the complex time-frequency transform of the input signal.

Advantageously, the method also comprises the following step:

- application of a frequency-time transformation to the dereverberated complex signal so as to obtain a dereverberated time signal.

Advantageously, the method also comprises a step for constructing a dereverberation filter according to the model $$G = \frac{\xi}{1+\xi}\exp\left(\int_{v}^{\infty}\frac{e^{-t}}{t}dt\right),$$

where ξ is the a priori signal-to-noise ratio and where the bound of integration υ is calculated according to the model $$v = \gamma\frac{\xi}{1+\xi}$$

where γ is the a posteriori signal-to-noise ratio.

The invention also relates to a device for suppressing the late reverberation of an audio signal, characterized in that it comprises means for capturing an input signal formed by the superimposition of several delayed and attenuated versions of the audio signal, applying a time-frequency transformation to the input signal in order to obtain a complex time-frequency transform of the input signal, calculating a plurality of prediction vectors, creating a plurality of observation vectors from the modulus of the complex time-frequency transform of the input signal, constructing a plurality of synthesis dictionaries from the plurality of observation vectors, estimating a late reverberation spectrum from the plurality of synthesis dictionaries and the plurality of prediction vectors, filtering the plurality of observation vectors so as to eliminate the late reverberation spectrum and obtain a dereverberated signal modulus.

DESCRIPTION OF THE FIGURES

The invention will be more clearly understood by reading the following description, given as a nonlimiting example in reference to the figures, which show.

In these figures, references that are identical from one figure to another designate identical or comparable elements. For the sake of clarity, the elements shown are not to scale, unless otherwise indicated.

DETAILED DESCRIPTION OF THE EMBODIMENTS

Figure 1:
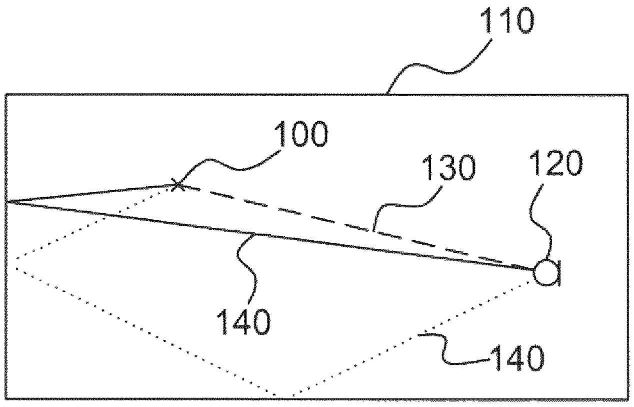
Fig.1 (Prior Art)
FIG. 1 (already described): a schematic illustration of an omnidirectional sound source and a microphone positioned in an enclosed space according to an exemplary embodiment of the invention.
Figure 2:
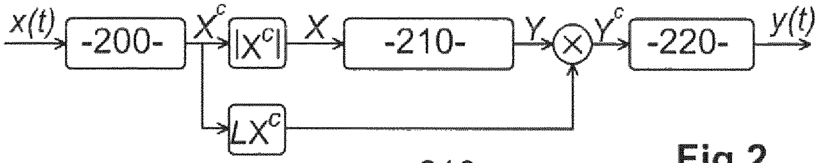
FIG. 2: a schematic illustration of an audio signal dereverberation device according to an exemplary embodiment of the invention.
Figure 3:
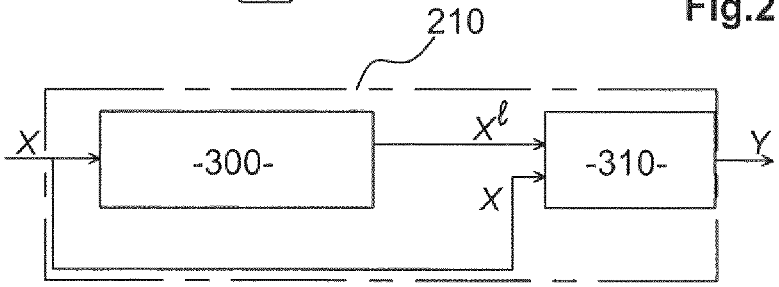
FIG. 3: a schematic illustration of a dereverberation unit of an audio signal dereverberation device according to an exemplary embodiment of the invention.
Figure 4:
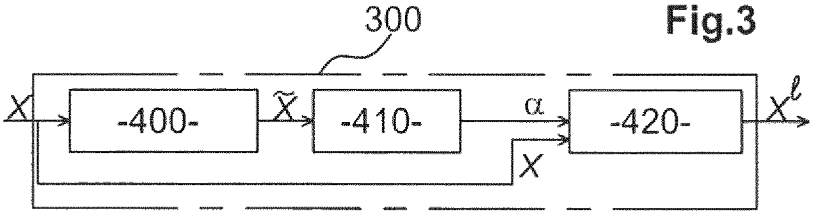
FIG. 4: a schematic illustration of a late reverberation estimation unit of an audio signal dereverberation device according to an exemplary embodiment of the invention.
Figure 7:
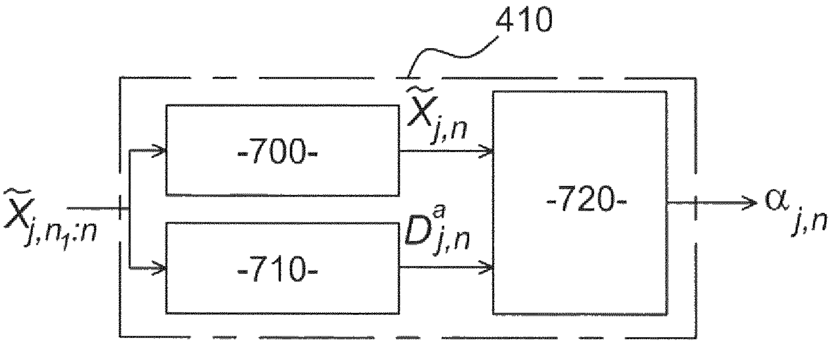
FIG. 7: a schematic illustration of a prediction vector calculation unit of an audio signal dereverberation device according to an exemplary embodiment of the invention.
Figure 8:
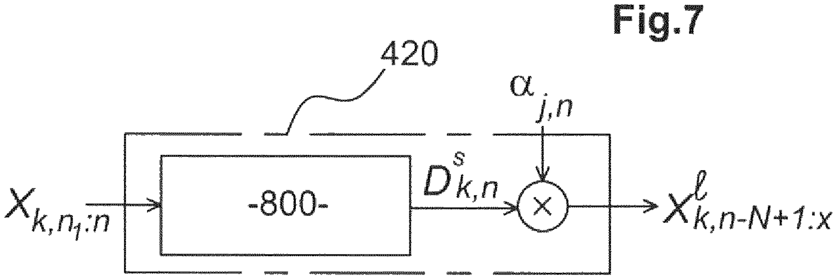
FIG. 8: a schematic illustration of a reverberation evaluation unit of an audio signal dereverberation device according to an exemplary embodiment of the invention.
Figure 9:
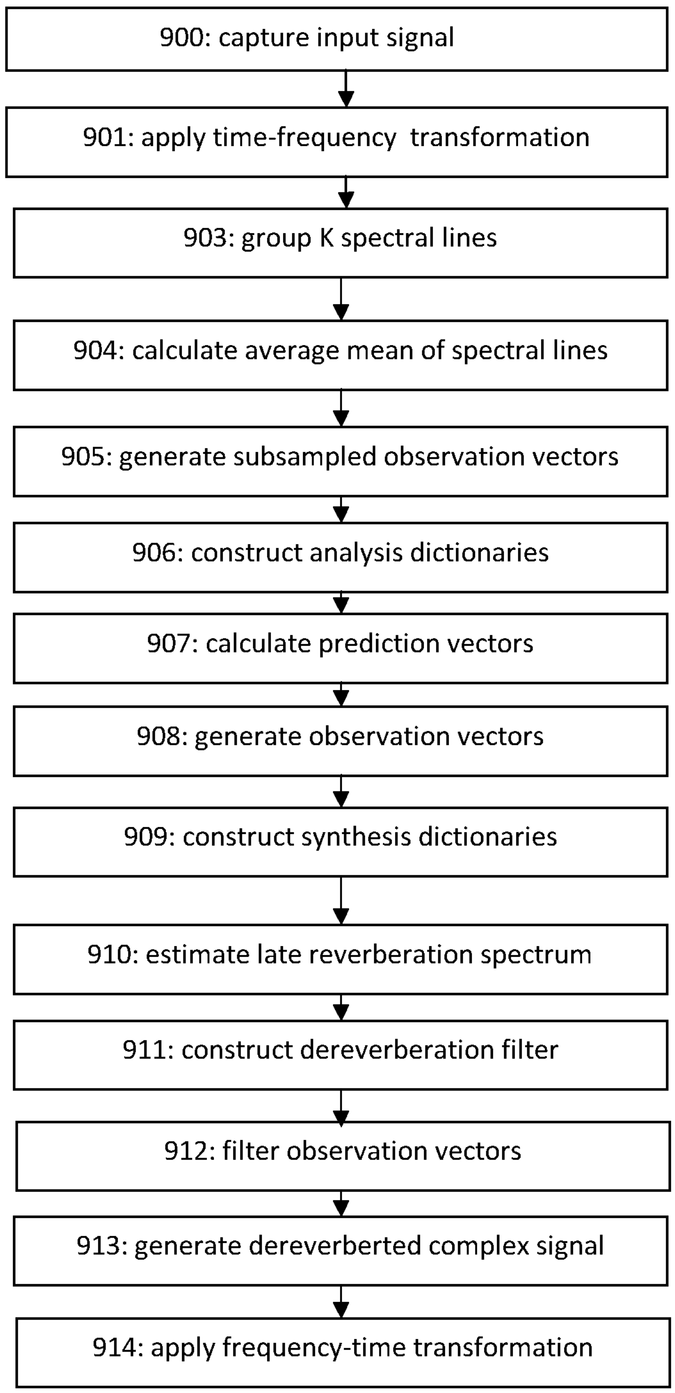
FIG. 9: a functional diagram showing various steps of the method according to an exemplary embodiment of the invention.

The invention uses a device for dereverberating an audio signal emitted by an omnidirectional sound source 100 positioned in an enclosed space 110 such as an automotive vehicle or a room and captured by a microphone 120. Said dereverberation device is inserted into the audio processing chain of a device such as a telephone. This dereverberation device comprises a unit for applying a time-frequency transform 200, a dereverberation unit 210, and a unit for applying a frequency-time transform 220 (cf. FIG. 2). The dereverberation unit 210 comprises a late reverberation estimation unit 300 and a filtering unit 310 (cf. FIG. 3). The late reverberation estimation unit 300 comprises a subband grouping unit 400, a prediction vector calculation unit 410 and a reverberation evaluation unit 420 (cf. FIG. 4). The prediction vector calculation unit 410 comprises an observation construction unit 700, an analysis dictionary construction unit 710 and a LASSO solving unit 720 (cf. FIG. 7). The reverberation evaluation unit 420 comprises a synthesis dictionary construction unit 800 (cf. FIG. 8).

In a step 900, a microphone 120 captures an input signal x(t) formed by the superimposition of several delayed and attenuated versions of the audio signal emitted by the omnidirectional sound source 100. In essence, the microphone 120 initially captures the source signal 130, also called the direct signal 130, but also the signals 140 reflected off the walls of the enclosed space 110. The various reflected signals 140 have traveled along acoustic paths of various lengths and have been attenuated by the absorption of the walls of the enclosed space 110; the phase and the amplitude of the reflected signals 140 captured by the microphone 120 are therefore different.

There are two types of reflections, early reflections and late reverberation. The microphone 120 captures the early reflection signals with a slight delay relative to the source signal 130, on the order of zero to fifty milliseconds. Said early reflection signals are temporally and spatially separated from the source signal 130, but the human ear does not perceive these early reflection signals and the source signal 130 separately due to an effect called the "precedence effect." When the audio signal emitted by the omnidirectional sound source 100 is a speech signal, the temporal integration of the early reflection signals by the human ear makes it possible to enhance certain characteristics of the speech, which improves the intelligibility of the audio signal.

The microphone 120 captures the late reverberation fifty to eighty milliseconds after the arrival of the source signal 130. The late reverberation comprises numerous reflected signals that are close together in time and therefore impossible to separate. This set of reflected signals is thus considered from a probability standpoint to be a random distribution whose density increases with time. When the audio signal emitted by the omnidirectional sound source 100 is a speech signal, the late reverberation degrades both the quality of said audio signal and its intelligibility. Said late reverberation also affects the performance of speech recognition and sound source separation systems.

The input signal x(t) is sampled at a sampling frequency $f_s$. The input signal x(t) is thus subdivided into samples. In order to suppress the late reverberation of said input signal x(t), the power spectral density of the late reverberation is estimated, after which a dereverberation filter is constructed by the dereverberation unit 210. The estimation of the power spectral density of the late reverberation, the construction of the dereverberation filter, and the application of said dereverberation filter are performed in the frequency domain. Thus, in a step 901, a time-frequency transformation is applied to the input signal x(t) by the Short-Term Fourier Transform application unit 200 in order to obtain a complex time-frequency transform of the input signal x(t), notated $X^C$ (cf. FIG. 2). In one example, the time-frequency transform is a Short-Term Fourier Transform.

Each element $X^C_{k,n}$ of the complex time-frequency transform $X^C$ is calculated as follows:

$$X^C_{k,n} = \sum_{m=0}^{M-1} x(m+nR)w(m)e^{\frac{2j\pi km}{M}}$$

where k is a frequency subsampling index with a value between 1 and a number K, n is a time index with a value between 1 and a number N, w(m) is a sliding analysis window, m is the index of the elements belonging to a frame, M is the length of a frame, i.e. the number of samples in a frame, and R is the hop size of the time-frequency transformation.

The input signal x(t) is analyzed by frames of length M with a hop size R equal to M/4 samples. For each frame of the input signal x(t) in the time domain, a discrete time-frequency transform with a frequency sampling index k and a time index n is thus calculated using the algorithm of the time-frequency transformation in order to obtain a complex signal $X^C_{k,n}$, defined by $$X_{k,n}{}^C = |X_{k,n}|e^{-j\angle X_{k,n}}$$

where $|X_{k,n}|$ is the modulus of the complex signal $X^C_{k,n}$, and $\angle X_{k,n}$ is the phase of the complex signal $X^C_{k,n}$.

The estimation of the power spectral density of the late reverberation is performed on the modulus of the complex time-frequency transform of the input signal $X^C$, notated X. The phase of the complex time frequency transform $X^C$, notated $\angle X$, is stored in memory and is used to reconstruct a dereverberated signal in the time domain after the application of the dereverberation filter.

Figure 5:
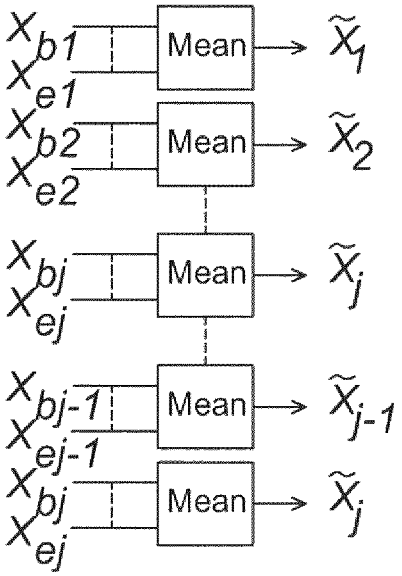
FIG. 5: a schematic illustration of a subband grouping of a modulus of a complex time-frequency transform of an input signal according to an exemplary embodiment of the invention.

The modulus X of the complex time-frequency transform of the input signal $X^C$ is then grouped into subbands. More precisely, said modulus X comprises the number K of spectral lines notated $X_k$. The term "spectral line" in this context designates all the samples of the modulus X of the complex time-frequency transform of the input signal $X^C$ for the frequency sampling index k and all of the time indices n. In a step 903, the subband grouping unit 400 groups the K spectral lines $X_k$ into a number J of subbands, in order to obtain a frequency subsampled modulus notated $\tilde{X}$ comprising a number J of spectral lines notated $\tilde{X}_j$, where j is a frequency subsampling index between 1 and the number J. The number J is less than the number K. Each subband thus comprises a plurality of spectral lines $X_k$, the frequency index k belonging to an interval having a lower bound $b_j$ and an upper bound $e_j$. In one example, each subband corresponds to an octave in order to adapt to the sound perception model of the human ear. Next, in a step 904, the subband grouping unit 400 calculates, for each subband, an average Mean of the spectral lines $X_k$ of said subband in order to obtain the J spectral lines $\tilde{X}_j$ of the frequency subsampled modulus $\tilde{X}$ (cf. FIG. 5).

Figure 6:
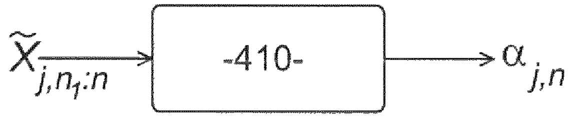
FIG. 6: a schematic illustration of a prediction vector calculation unit of an audio signal dereverberation device according to an exemplary embodiment of the invention.

Next, the prediction vector calculation unit 410 calculates for each spectral line $\tilde{X}_j$ of the frequency subsampled modulus $\tilde{X}$, subsampled modulus and for each time index n, a prediction vector $\alpha_{j,n}$ (cf. FIG. 6). More precisely, in a step 905, the observation construction unit 700 constructs, for each time index n and frequency subsampling index j, a subsampled observation vector $\tilde{X}v_{j,n}$ from the set of samples $\tilde{X}_{j,n_1:n}$ belonging to the jth spectral line $\tilde{X}_j$ of the frequency subsampled modulus $\tilde{X}$ and falling between the instants $n_1=n-N+1$ and n, where n is the index of the current instant and $n-n_1$ is the size of the memory of the dereverberation device. Each subsampled observation vector $\tilde{X}v_{j,n}$ is defined by:

$$\tilde{X}v_{j,n} := [\tilde{X}_{j,n} \ldots \tilde{X}_{j,n-N+1}]^T$$

Each observation vector $\tilde{X}v_{j,n}$ has the size of N×1, where the number N is the length of the observation. The length of the observation N is the number of frames of the time-frequency transformation required for the estimation of the late reverberation. The length of the observation N makes it possible to define the time resolution of the estimation. When the length of the observation N increases, the complexity of the system is reduced. The subsampling of the modulus X of the complex time-frequency transform of the input signal $X^C$ makes it possible, among other things, to apply the method in real time.

In a step 906, the analysis dictionary construction unit 710 constructs analysis dictionaries $D^\alpha$. More precisely, for each time index n and frequency subsampling index j, an analysis dictionary $D_{j,n}{}^\alpha$ is constructed by concatenating a number L of past observation vectors determined in step 905. The analysis dictionary $D_{j,n}{}^\alpha$ is thus defined as the matrix $$D^\alpha_{j,n} := \begin{bmatrix} \tilde{X}_{j,n-\delta} & \tilde{X}_{j,n-\delta-1} & \cdots & \tilde{X}_{j,n-\delta-L+1} \\ \tilde{X}_{j,n-\delta-1} & \tilde{X}_{j,n-\delta-2} & \cdots & \tilde{X}_{j,n-\delta-L} \\ \vdots & \vdots & \vdots & \vdots \\ \tilde{X}_{j,n-\delta-N+1} & \tilde{X}_{j,n-\delta-N} & \cdots & \tilde{X}_{j,n-\delta-L-N+2} \end{bmatrix}$$

where L is the number of past observation vectors and hence the size of the analysis dictionary $D_{j,n}{}^\alpha$ and $\delta \in R^*$ is the delay of the analysis dictionary $D_{j,n}{}^\alpha$. More precisely, the delay δ is the frame delay between the current subsampled observation vector $\tilde{X}v_{j,n}$ and the other subsampled observation vectors belonging to the analysis dictionary $D_{j,n}{}^\alpha$. Said delay δ makes it possible to reduce the distortions introduced by the method. This delay δ also makes it possible to improve the separation of the late reverberation from the early reflections. In order to calculate the current observation vector $\tilde{X}v_{j,n}$ and the analysis dictionary $D_{j,n}{}^\alpha$ and thus the prediction vector $\alpha_{j,n}$ for each spectral line $\tilde{X}_j$ and for each time index n, a number L+N+δ of frames must be stored in memory.

In a step 907, the LASSO solving unit 720 solves a so-called "LASSO" problem, which is to minimize the Euclidean norm $\|\tilde{X}v_{j,n}-D_{j,n}{}^\alpha\alpha_{j,n}\|_2$, taking into account the constraint $|\alpha_{j,n}\|_1 \leq \lambda$, where λ is a maximum intensity parameter. In order to solve said problem, the best linear combination of the L vectors of the dictionary for approximating the current observation must be found. In one example, a method known as LARS, the English acronym for "Least Angle Regression," makes it possible to solve said problem. The constraint $|\alpha_{j,n}\|_1 \leq \lambda$ makes it possible to favor solutions that have few non-zero elements, i.e. sparse solutions. The maximum intensity parameter λ makes it possible to adjust the estimated maximum intensity of the late reverberation. This maximum intensity parameter λ theoretically depends on the acoustic environment, i.e. in one example the enclosed space 110. For each enclosed space 110, there is an optimal value of the maximum intensity parameter λ. However, tests have shown that said maximum intensity parameter λ can be set at an identical value for all enclosed spaces 110 without said parameter's introducing degradations relative to the optimal value. Thus, the method works in a great variety of enclosed spaces 110 without requiring any particular adjustment, making it possible to avoid errors in the estimation of the reverberation time of the enclosed space 110. Moreover, the method according to the invention does not require any parameters that must be estimated, thus enabling said method to be applied in real time. The value of the maximum intensity parameter $\lambda$ is between 0 and 1. In one example, the value of the maximum intensity parameter $\lambda$ is equal to 0.5, which is a good compromise between the reduction of the reverberation and the overall quality of the method.

In a step 908, for each time index n and each frequency subsampling index k, a current observation vector $Xv_{k,n}$ is created from the set of samples belonging to the kth spectral line $X_k$ of the modulus X of the complex time-frequency transform and falling between the instants $n_1$ and n, notated $X_{k,n_1:n}$, where n is the currant instant index and $n-n_1$ is the size of the memory of the dereverberation device. Each observation vector $Xv_{k,n}$ is defined by the formula $Xv_{k,n}:=[X_{k,n} \ldots X_{k,n-N+1}]^r$ and is of a size N×1, where N is the length of the observation.

In a step 909, the synthesis dictionary construction unit 800 constructs a synthesis dictionary $D^s$. More precisely, for each time index n and each frequency sampling index k, the synthesis dictionary $D_{k,n}^s$ is constructed by concatenating a number L of past observation vectors determined in step 908. The synthesis dictionary $D_{k,n}^s$ is thus defined as the matrix $$D_{k,n}^s := \begin{bmatrix} X_{k,n-\delta} & X_{k,n-\delta-1} & \ldots & X_{k,n-\delta-L+1} \\ X_{k,n-\delta-1} & X_{k,n-\delta-2} & \ldots & X_{k,n-\delta-L} \\ \vdots & \vdots & \vdots & \vdots \\ X_{k,n-\delta-N+1} & X_{k,n-\delta-N} & \ldots & X_{k,n-\delta-L-N+2} \end{bmatrix}$$

where L and $\delta$ are the same parameters as for the analysis dictionary $D_{j,n}^{\alpha}$.

In a step 910, for each time index n and each frequency sampling index k, an estimation of the power spectral density of the late reverberation or the spectrum of the late reverberation $X_{k,n}^l$ is constructed by a multiplication of the synthesis dictionary $D_{k,n}^s$ with the prediction vector $\alpha_{j,n}$ according to the formula $$X_{k,n}^l = D_{k,n}^s \alpha_{j,n} \forall k \in \lfloor b_j, e_j \rfloor,\ j=1, \ldots, J$$

Thus, the prediction vector $\alpha_{j,n}$ indicates the columns of the synthesis dictionary that have been used for the estimation of the reverberation, and the contribution of each of them to the reverberation. The spectrum of the late reverberation $X^l$ is considered in the rest of the method as a noise signal to be eliminated.

To this end, a filtering of the reverberation is performed by the filtering unit 310. More precisely, in a step 911, for each time index n and each frequency sampling index k, a dereverberation filter $G_{k,n}$ is constructed according to the formula $$G_{k,n} = \frac{\xi_{k,n}}{1+\xi_{k,n}} \exp\left( \int_{v_{k,n}}^{\infty} \frac{e^{-t}}{t} dt \right)$$

where $\zeta_{k,n}$ is the a priori signal-to-noise ratio, calculated as follows $$\xi_{k,n} = \beta G_{k,n-1}^2 \gamma_{k,n-1} + (1-\beta)\max\{\gamma_{k,n}-1,0\}$$

and where the bound of integration $v_{k,n}$ is calculated as follows $$v_{k,n} = \gamma_{k,n} \frac{\xi_{k,n}}{1+\xi_{k,n}}$$

where $\gamma_{k,n}$ is the a posteriori signal-to-noise ratio, calculated according to the formula $$\gamma_{k,n} = \frac{|X_{k,n}|^2}{|R_{k,n}|^2}$$

where $R_{k,n}$ is the late reverberation calculated as follows $$R_{k,n} = \alpha R_{k,n-1} + (1-\alpha)|X_{k,n}^l|$$

where $\alpha$ is a first smoothing constant and $\beta$ is a second smoothing constant. In one example, the first smoothing constant $\alpha$ equals 0.77 and the second smoothing constant $\beta$ equals 0.98.

In essence, the estimated reverberation is not stationary in the long-term because the audio signal emitted by the omnidirectional sound source 100 that gives rise to said estimated reverberation is not stationary in the long term. Overly fast variations of the estimated reverberation can introduce annoying artifacts during the filtering. To limit these effects, a recursive smoothing is performed in order to calculate the power spectral density of the late reverberation.

In a step 912, for each time index n and each frequency sampling index k, the observation vectors $Xv_{k,n}$ are filtered by the dereverberation filter $G_{k,n}$ calculated in step 911 so as to obtain a dereverberated signal modulus $Y_{k,n}$ calculated as follows $$Y_{k,n} = G_{k,n} X_{k,n}.$$

The filter constructed in step 911 strongly attenuates certain observation vectors $Xv_{k,n}$, which generates artifacts that can be detrimental to the quality of the dereverberated signal. To limit said artifacts, a lower bound is imposed on the attenuation of the filter. Thus, for each frequency sampling index k and for each time index n, if the dereverberation filter $G_{k,n}$ is less than or equal to a minimum value of the dereverberation filter Gmin, then said dereverberation filter $G_{k,n}$ is equal to said minimum value of the dereverberation filter Gmin.

In a step 913, for each frequency sampling index k and each time index n, the dereverberated signal modulus $Y_{k,n}$ and the phase $\angle X_{k,n}$ of the complex signal $X^C_{k,n}$ are multiplied in order to create a dereverberated complex signal $Y^C$.

In a step 914, a frequency-time transformation is applied by the frequency-time transformation application unit 220 to the dereverberated complex signal $Y_{k,n}^C$ in order to obtain a dereverberated time signal y(t) in the time domain. In one example, the frequency-time transformation is an Inverse Short-Term Fourier Transform.

In one embodiment, the value of the number of observation vectors L is equal to 10, the value of the number N of the length of the observation is equal to 8, the value of the delay $\delta$ is equal to 5, the value of the maximum intensity parameter $\lambda$ is equal to 0.5, the value of the number K is equal to 257, the value of the number J is equal to 10, the value of the length of a frame M is equal to 512, and the minimum value of the dereverberation filter Gmin is equal to −12 decibels. The choice of these parameters enables the method to be applied in real time.

The method for suppressing the late reverberation of an audio signal according to the invention is fast and offers reduced complexity. Said method can therefore be used in real time. Moreover, this method does not introduce artifacts and is resistant to background noise. Furthermore, said method reduces background noise and is compatible with noise-reduction methods.

The method for suppressing the late reverberation of an audio signal according to the invention requires only one microphone to process the reverberation with precision.

The invention claimed is:

1. Method for suppressing a late reverberation of an audio signal, comprising the steps of:

capturing an input signal formed by a superimposition of several delayed and attenuated versions of the audio signal;

applying a time-frequency transformation to the input signal to obtain a complex time-frequency transform of the input signal;

generating a frequency subsampled modulus from a modulus of the complex time-frequency transform of the input signal;

generating a plurality of subsampled observation vectors from said frequency subsampled modulus;

constructing a plurality of analysis dictionaries from the plurality of subsampled observation vectors;

calculating a plurality of prediction vectors from the plurality of subsampled observation vectors and the plurality of analysis dictionaries by minimizing, for each prediction vector ($\alpha$), the expression $\|\tilde{X}v-D^{\alpha}\alpha\|_2$, which is an Euclidean norm of a difference between the subsampled observation vector ($\tilde{X}_v$) associated with said each prediction vector ($\alpha$) and the analysis dictionary ($D^{\alpha}$) associated with said each prediction vector ($\alpha$) multiplied by said each prediction vector ($\alpha$), with a constraint $\|\alpha\|_1 \leq \lambda$, according to which the norm 1 of said each prediction vector ($\alpha$) is less than or equal to a maximum intensity parameter of the late reverberation ($\lambda$);

generating a plurality of observation vectors from the modulus of the complex time-frequency transform of the input signal;

constructing a plurality of synthesis dictionaries from a concatenation of the plurality of observation vectors;

estimating a late reverberation spectrum from a multiplication of the plurality of synthesis dictionaries with the plurality of prediction vectors; and filtering the plurality of observation vectors to eliminate the late reverberation spectrum and to obtain a dereverberated signal modulus.

2. The method according to claim 1, wherein a value of the maximum intensity parameter of the late reverberation ($\lambda$) is between 0 and 1.

3. The method according to claim 1, further comprising the step of generating a dereverberated complex signal from the dereverberated signal modulus and a phase of the complex time-frequency transform of the input signal.

4. The method according to claim 3, further comprising the step of applying a frequency-time transformation to the dereverberated complex signal to obtain a dereverberated time signal.

5. The method according to claim 1, further comprising the step of constructing a dereverberation filter (G) according to the model $$G = \frac{\xi}{1+\xi}\exp\left(\int_{v}^{\infty}\frac{e^{-t}}{t}dt\right),$$

$\xi$ is the a priori signal-to-noise ratio and where a bound of integration $\upsilon$ is calculated according to the model $$v = \gamma\frac{\xi}{1+\xi}$$

where $\gamma$ is the a posteriori signal-to-noise ratio.

6. A device for suppressing a late reverberation of an audio signal, comprising:

a microphone to capture an input signal formed by a superimposition of several delayed and attenuated versions of the audio signal;

a time-frequency unit to apply a time-frequency transformation to the input signal to obtain a complex time-frequency transform of the input signal;

a subband grouping unit generates a frequency subsampled modulus from the modulus of the complex time-frequency transform of the input signal;

an observation construction unit generates a plurality of subsampled observation vectors from said frequency subsampled modulus;

an analysis dictionary construction unit constructs a plurality of analysis dictionaries from the plurality of subsampled observation vectors;

a prediction vector calculation unit calculates a plurality of prediction vectors from the plurality of subsampled observation vectors and the plurality of analysis dictionaries by minimizing, for each prediction vector, the expression $\|\tilde{X}v-D^{\alpha}\alpha\|_2$, which is an Euclidean norm of a difference between the subsampled observation vector associated with said each prediction vector ($\alpha$) and the analysis dictionary associated with said each prediction vector ($\alpha$) multiplied by said each prediction vector ($\alpha$), with a constraint $\|\alpha\|_1 \leq \lambda$, according to which the norm 1 of said each prediction vector ($\alpha$) is less than or equal to a maximum intensity parameter of the late reverberation ($\lambda$);

a reverberation evaluation unit generates a plurality of observation vectors from the modulus of the complex time-frequency transform of the input signal;

a synthesis dictionary constructing unit constructs a plurality of synthesis dictionaries from the concatenation of the plurality of observation vectors;

a late reverberation estimation unit estimates a late reverberation spectrum from the multiplication of the plurality of synthesis dictionaries with the plurality of prediction vectors; and a filtering unit to filter the plurality of observation vectors so as to eliminate the late reverberation spectrum and obtain a dereverberated signal modulus.

* * * * *